United States Patent
Maple et al.

(10) Patent No.: US 9,997,428 B2
(45) Date of Patent: *Jun. 12, 2018

(54) VIA STRUCTURES FOR THERMAL DISSIPATION

(71) Applicant: Avago Technologies General IP (Singapore) Pte. Ltd., Singapore (SG)

(72) Inventors: Marshall Maple, Cupertino, CA (US); Ashish Alawani, San Jose, CA (US); Li Sun, Fremont, CA (US); Sarah Haney, San Jose, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days. days.

This patent is subject to a terminal disclaimer.

(21) Appl. No.: 14/799,534

(22) Filed: Jul. 14, 2015

(65) Prior Publication Data
US 2017/0018478 A1    Jan. 19, 2017

(51) Int. Cl.
*H01L 23/367* (2006.01)
*H01L 21/768* (2006.01)
(Continued)

(52) U.S. Cl.
CPC .......... *H01L 23/367* (2013.01); *H01L 21/486* (2013.01); *H01L 21/4857* (2013.01); *H01L 21/76816* (2013.01); *H01L 23/3677* (2013.01); *H01L 23/49822* (2013.01); *H01L 23/49827* (2013.01); *H01L 29/20* (2013.01); *H01L 29/737* (2013.01); *H01L 29/778* (2013.01); *H05K 1/0206* (2013.01); *H05K 1/113* (2013.01); *H05K 3/0026* (2013.01); *H01L 23/3735* (2013.01); *H01L 2224/16227* (2013.01);
(Continued)

(58) Field of Classification Search
CPC ..... H01L 23/48; H01L 29/40; H01L 23/3677; H01L 2924/10253; H01L 2924/01077; H01L 2924/02078; H01L 2924/13091; H01L 2924/14; H01L 2924/19041; H01L 2924/30107; H01L 2924/3011; H01L 24/48; H01L 24/29; H01L 2924/01055; H01L 23/45; H01L 2924/00; H01L 2924/00014; H01L 23/367; H01L 21/768; H01L 21/48; H01L 29/20; H01L 29/778; H01L 29/737; H01L 23/498; H05K 1/11; H05K 3/00; H05K 1/02
USPC .......... 257/774, 773, 698, 692, 723, E23.105
See application file for complete search history.

(56) References Cited

U.S. PATENT DOCUMENTS 5,883,737 A * 3/1999 Fujikawa .............. H01S 3/0941
                                                                  359/345
6,748,650 B2    6/2004 Singh
(Continued)

FOREIGN PATENT DOCUMENTS

GB         2325082         11/1998

OTHER PUBLICATIONS

Restriction Requirement dated May 15, 2017 in co-pending U.S. Appl. No. 14/928,055, 7 pages.
(Continued)

*Primary Examiner* — Alexander Oscar Williams

(57) ABSTRACT

An apparatus, a semiconductor package including the apparatus and a method are disclosed. The apparatus includes a substrate, pluralities of vias disposed in the substrate. The vias are disposed in a hexagonal arrangement.

40 Claims, 11 Drawing Sheets

(51) Int. Cl.
*H01L 21/48* (2006.01)
*H01L 29/20* (2006.01)
*H01L 23/498* (2006.01)
*H05K 1/02* (2006.01)
*H05K 1/11* (2006.01)
*H05K 3/00* (2006.01)
*H01L 29/778* (2006.01)
*H01L 29/737* (2006.01)
*H05K 3/46* (2006.01)
*H01L 23/373* (2006.01)

(52) U.S. Cl.
CPC ............... *H01L 2224/16235* (2013.01); *H01L 2924/1037* (2013.01); *H01L 2924/10252* (2013.01); *H01L 2924/10253* (2013.01); *H01L 2924/10271* (2013.01); *H01L 2924/10329* (2013.01); *H01L 2924/13051* (2013.01); *H01L 2924/13064* (2013.01); *H01L 2924/13091* (2013.01); *H01L 2924/1421* (2013.01); *H01L 2924/15313* (2013.01); *H05K 1/0207* (2013.01); *H05K 3/4644* (2013.01); *H05K 2201/09509* (2013.01)

(56) References Cited

U.S. PATENT DOCUMENTS

| | | | |
|---|---|---|---|
| 7,026,664 B2 | 4/2006 | Divakar et al. | |
| 8,314,472 B2 | 11/2012 | Parkhurst et al. | |
| 8,344,504 B2 | 1/2013 | Wholey et al. | |
| 8,378,495 B2 * | 2/2013 | West | H01L 23/481 257/472 |
| 8,502,081 B2 | 8/2013 | Kanemaru et al. | |
| 8,536,707 B2 | 9/2013 | Wholey et al. | |
| 8,575,758 B2 * | 11/2013 | West | H01L 21/78 257/686 |
| 8,670,471 B2 * | 3/2014 | Kim | B82Y 20/00 372/21 |
| 8,680,404 B2 | 3/2014 | Ryoichi et al. | |
| 8,802,504 B1 * | 8/2014 | Hou | H01L 23/49811 438/108 |
| 8,946,904 B2 | 2/2015 | Railkar et al. | |
| 9,030,021 B2 * | 5/2015 | Song | H01L 23/49827 257/737 |
| 9,299,649 B2 * | 3/2016 | Chiu | H01L 23/49816 |
| 9,589,865 B2 | 3/2017 | Dungan et al. | |
| 2004/0212073 A1 * | 10/2004 | Divakar | H01L 23/3677 257/698 |
| 2010/0265671 A1 | 10/2010 | Tsai et al. | |
| 2011/0013787 A1 * | 1/2011 | Chang | H04R 19/005 381/174 |
| 2011/0316148 A1 | 12/2011 | Kondo | |
| 2012/0049345 A1 * | 3/2012 | Railkar | H01L 23/3677 257/737 |
| 2012/0146180 A1 * | 6/2012 | Roy | H01L 23/49822 257/531 |
| 2012/0243446 A1 | 9/2012 | Mueller et al. | |
| 2013/0140265 A1 * | 6/2013 | Kim | H01G 4/33 216/6 |
| 2013/0187280 A1 * | 7/2013 | Yuan | H01L 23/481 257/773 |
| 2013/0248584 A1 * | 9/2013 | Bi | H01L 33/64 228/176 |
| 2015/0217995 A1 | 8/2015 | Teh et al. | |
| 2015/0228416 A1 | 8/2015 | Hurwitz | |
| 2015/0351229 A1 | 12/2015 | Lee et al. | |
| 2016/0073496 A1 | 3/2016 | Vincent | |
| 2017/0018501 A1 * | 1/2017 | Maple | H01L 23/5283 |
| 2017/0127523 A1 | 5/2017 | Fritz et al. | |

OTHER PUBLICATIONS

Office Action dated February 19, 2016 in co-pending U.S. Appl. No. 14/929,309, 20 pages.
Office Action dated August 24, 2016 in co-pending U.S. Appl. No. 14/929,309, 17 pages.
Office Action dated August 30, 2017 in co-pending U.S. Appl. No. 14/928,355, 11 pages.

* cited by examiner

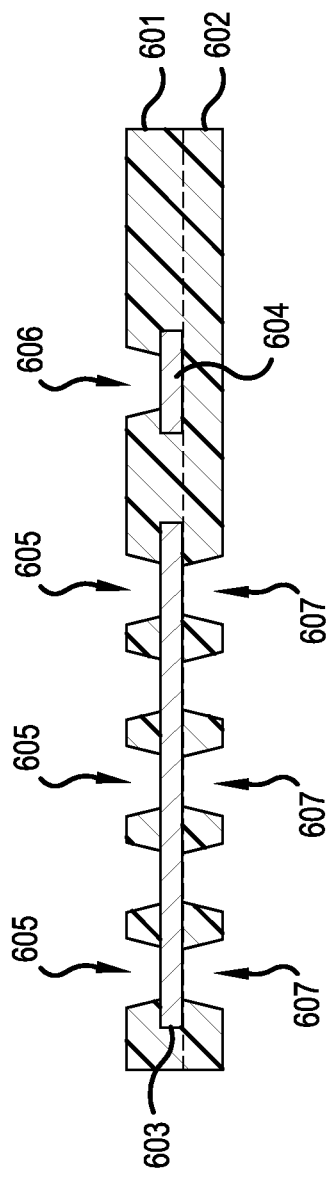
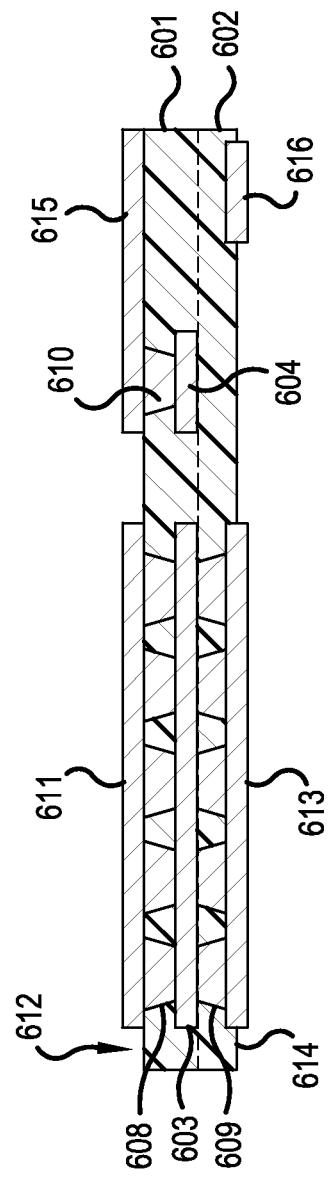
FIG.6A
FIG.6B

VIA STRUCTURES FOR THERMAL DISSIPATION

BACKGROUND

Packaging of semiconductor devices in die form has lead to the implementation of various techniques to effect electrical connections to the semiconductor devices as well as to effect paths to dissipate heat. Often, the semiconductor devices are mounted over a printed circuit board (PCB).

Efficient heat transfer from the die through the PCB is required to remove the heat generated by the die, which can often include power semiconductor devices that generate significant heat during operation. This heat, coupled with the coefficient of thermal expansion (CTE) mismatches between the die and PCB, can result in significant mechanical stress in the combined structure.

What is needed, therefore, is an apparatus that provides an improved thermal dissipation, while overcoming issues of CTE mismatch problematic in known structures.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

FIGS. 6A-6F show cross-sectional views of a sequence of fabricating a semiconductor structure in accordance with a representative embodiment.

DETAILED DESCRIPTION

Figure 1A:
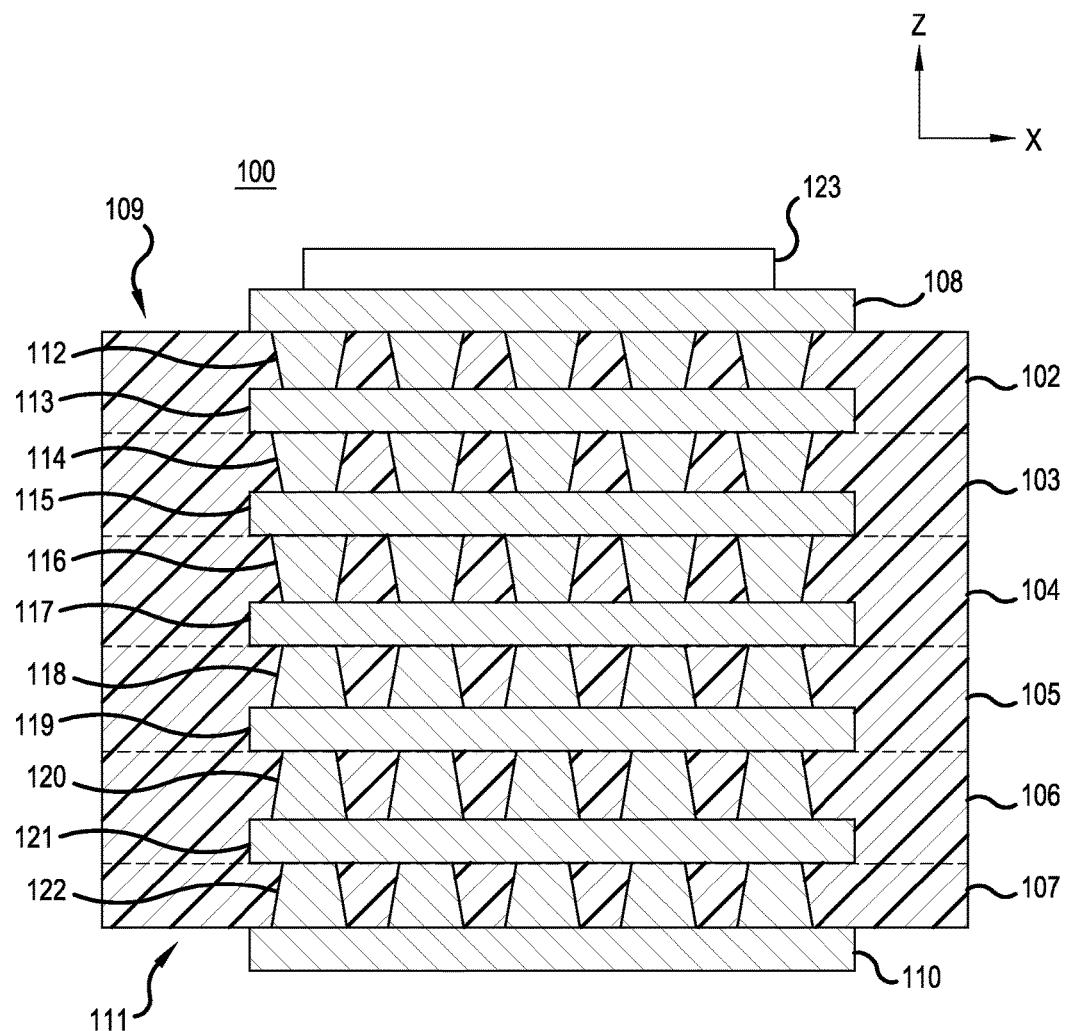
FIG. 1A shows cross-sectional view of a semiconductor package in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the elements thereof in addition to the orientation depicted in the drawings. For example, if an apparatus (e.g., a semiconductor package) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

According to representative embodiments described below, an apparatus is disclosed. The apparatus may be referred to below as a semiconductor package, which may or may not include a semiconductor die. The apparatus comprises a substrate, and a first plurality of vias disposed in the substrate. The vias are disposed in a hexagonal arrangement, and a pad is disposed beneath the first plurality of vias. The apparatus also comprises: a second plurality of vias disposed in the substrate and beneath the pad, the second plurality of vias being disposed in the hexagonal arrangement; and a capture pad disposed over an upper surface of the substrate, and in direct contact with at least one of the first plurality of vias. Moreover, in accordance with a representative embodiment, a method of fabricating the apparatus is described below.

Certain details of the materials and structures, and devices, of the apparatuses of the present teachings are described in one or more of the following commonly owned U.S. Patents, which are specifically incorporated herein by reference: U.S. Pat. Nos. 8,946,904; 8,536,707; 8,344,504; and 8,314,472.

FIG. 1A shows a cross-sectional view of a semiconductor package 100 in accordance with a representative embodiment. The semiconductor package 100 comprises a substrate 101. The substrate 101 comprises a first layer 102, a second layer 103, a third layer 104, a fourth layer 105, a fifth layer 106, and a sixth layer 107 (sometimes referred to collectively herein as layers 102-107). It is emphasized that the selection of six layers (layers 102-107) is merely illustrative, and that the substrate 101 may comprise more or fewer layers than six layers. As should be appreciated, the number of layers is selected based on design considerations and input/output requirements. The principles of the substrate 101 and the principles of its fabrication described herein are applicable to more or fewer than six layers (e.g., layers 102-107). Notably, the boundary between each of the successive layers 102-107 is distinguished in the drawing with a dashed line as shown in FIG. 1A.

A first contact pad 108 is disposed over an upper surface 109 of the first layer 102, and a second contact pad 110 is disposed over a lower surface 111 of the sixth layer 107. As described more fully below, the second contact pad 110 is connected thermally (and likely, electrically) to a heat sink (not shown), and fosters dissipation of heat, and, may be used as an electrical ground, as needed.

The first layer 102 comprises a first plurality of vias 112 disposed over a first capture pad 113. The first capture pad 113 is disposed over an upper surface (denoted by the dashed line) of the second layer 103.

The second layer 103 comprises a second plurality of vias 114 disposed over a second capture pad 115. The second capture pad 115 is disposed over an upper surface (denoted by the dashed line) of the third layer 104.

The third layer 104 comprises a third plurality of vias 116 disposed over a third capture pad 117. The third capture pad 117 is disposed over an upper surface (denoted by the dashed line) of the fourth layer 105.

The fourth layer 105 comprises a fourth plurality of vias 118 disposed over a fourth capture pad 119. The fourth capture pad 119 is disposed over an upper surface (denoted by the dashed line) of the fifth layer 106.

The fifth layer 106 comprises a fifth plurality of vias 120 disposed over a fifth capture pad 121. The fifth capture pad 121 is disposed over an upper surface (denoted by the dashed line) of the sixth layer 107.

Finally, the sixth layer 107 comprises a sixth plurality of vias 122 disposed over a second contact pad 110.

As described more fully below, each of the first-sixth pluralities of vias 112, 114, 116, 118, 120 and 122 are arranged in an array, with each array having vias respective first-sixth pluralities of vias 112, 114, 116, 118, 120 and 122 arranged in a hexagonal pattern. In accordance with representative embodiments, each of the first-sixth pluralities of vias 112, 114, 116, 118, 120 and 122 have a substantially circular cross-sectional shape, with a decreasing radius (e.g., first plurality of vias 112), or increasing radius (e.g., fourth plurality of vias 118), from one side to another as depicted in FIG. 1. As will become clearer as the present description continues, the variation in radius of the first-sixth pluralities of vias 112, 114, 116, 118, 120 and 122 is a result of the laser drilling technique used to form via openings in the various layers of the substrate 101. As such, the shape of the vias is not limited to the depicted shape. Rather, each of the first-sixth pluralities of vias 112, 114, 116, 118, 120 and 122 could be cylindrical with a substantially constant radius. Alternatively, each of the first-sixth pluralities of vias 112, 114, 116, 118, 120 and 122 could have other cross-sectional shapes with substantially constant, or increasing or decreasing areal dimensions along their length. Illustratively, the first-sixth pluralities of vias 112, 114, 116, 118, 120 and 122 could have elliptical cross-sectional shapes.

Each of the first-fifth capture pads 113, 115, 117, 119, 121, and the first and second contact pads 108, 110 have a substantially rectangular shape, or a substantially elliptical shape, and as described more fully below, provide a more efficient thermal path for heat dissipation, as well as provide structural stability, and allow for electrical connections to ground to be made from electrical circuit paths (not shown in FIG. 1A).

Each of the first-sixth pluralities of vias 112, 114, 116, 118, 120 and 122 comprises a material selected to provide suitable thermal conductivity. In a representative embodiment, the material may be a thermal and electrical conductor such as copper (Cu), silver (Ag), gold (Au) or aluminum (Al), or Tungsten (W) or alloys thereof. It is emphasized that this is merely illustrative and other materials may be used for the first-sixth pluralities of vias 112, 114, 116, 118, 120 and 122. To this end, first-sixth pluralities of vias 112, 114, 116, 118, 120 and 122 may comprise any metal or alloy, or, more generally, any material that provides sufficiently high thermal conductivity, and that is suitable for fabrication of the apparatuses (e.g., semiconductor packages) of the present teachings, and their implementation. Finally, in certain representative embodiments, more than one material may be used for one or more of the first-sixth pluralities of vias 112, 114, 116, 118, 120 and 122. For example, the outer portion of a via may comprise one material (e.g., copper) and be "filled" with another material (e.g., Al), such as a damascene via structure (not shown).

Similarly, each of the first-fifth capture pads 113, 115, 117, 119, 121, and the first and second contact pads 108, 110 may comprise any metal or alloy, or, more generally, any material that provides sufficiently high thermal and electrical conductivity, and that is suitable for fabrication of the apparatuses (e.g., semiconductor packages) of the present teachings. Generally, the first-fifth capture pads 113, 115, 117, 119, 121, and the first and second contact pads 108, 110 are made of the same material(s) as the first-sixth pluralities of vias 112, 114, 116, 118, 120 and 122.

The layers 102-107 may comprise a dielectric material or a ceramic material. Illustrative materials include, but are not limited to prepreg, so-called build-up films, polymers (including Teflon® and liquid crystal polymer (LCP)), aluminum oxide, ceramic or glass materials. As is known, build-up films comprise resin-based epoxy films with fillers, such as silica and alumina, added.

Depending on the application, a wide range of ceramic materials are also contemplated for first-sixth layers 102-107. Some examples include aluminum nitride, aluminum silicate, barium neodymium titanate, barium strontium titanate (BST), barium tantalate, barium titanate (BT), beryllia, boron nitride, calcium titanate, calcium magnesium titanate (CMT), magnesium aluminum silicate, lead zinc niobate (PZN), lithium niobate (LN), magnesium silicate, magnesium titanate, niobium oxide, porcelain, quartz, sapphire, strontium titanate, silica, tantalum oxide, zirconium oxide. Electrical traces (not shown in FIG. 1A) and passive electrical components (not shown) may be provided between the layers 102-107 to provide selective electrical connections and circuits in the substrate 101.

In the presently described representative embodiment, first contact pad 108 is provided over upper surface 109 of the substrate 101. In a representative embodiment, the first contact pad 108 provides an electrical connection and a thermal conduction path between a semiconductor die 123, and electrical ground and a thermal heat sink, respectively, of the present teachings. In certain embodiments, the semiconductor package 100, with or without the semiconductor die 123, may be referred to herein as an apparatus. A solder bump or pillar (not shown) may be provided between the first contact pad and the semiconductor die. Generally, but not necessarily, the semiconductor die 123 is "flip-chip" mounted over the substrate 101. The semiconductor die 123 illustratively comprises an active semiconductor device (not shown), and may comprise passive electrical components (not shown) and circuit traces (not shown). Illustratively, the semiconductor die 123 is a component (e.g., an output stage) of a power amplifier (e.g., a radio frequency (RF) amplifier) that generates significant heat during operation. The active semiconductor device is fabricated from a semiconductor material. Illustrative semiconductor materials for the active semiconductor device(s) include binary semiconductor materials (e.g., Group III-IV and Group IV-VI semiconductor materials), ternary semiconductor materials, silicon (Si) and silicon-germanium (SiGe), processed to form the active semiconductor device(s) of the semiconductor die 123, and electrical connections thereto. Moreover, the present teachings contemplate the use of synthetic diamond fabricated by a known chemical vapor deposition (CVD) method.

Illustratively, the active semiconductor device of the semiconductor die 123 comprises a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the semiconductor die 123 may comprise a combination of a plurality of the different active semiconductor devices to provide a desired circuit. Furthermore, the active devices of the semiconductor die 123 may provide power amplifiers and other devices that require heat dissipation. While such power devices are illustrative, other active semiconductor devices that do not require the same degree of heat dissipation as power devices (e.g., power amplifiers) are contemplated to be included in the semiconductor die 123.

As depicted in FIG. 1A, the first contact pad 108 has a width (x-direction in the coordinate system shown) and a depth (y-direction in the coordinate system shown) selected to ensure contact to all of the first plurality of vias 112. Similarly, the first capture pad 113 has a width and a depth selected to ensure contact to all of the first plurality of vias 112. In this way, and described below in connection with the remaining capture pads and pluralities of vias of each of the layers 102-107, heat generated by the semiconductor die 123, is spread out across the various layers of the substrate 101, and ultimately to the heat sink to which the second contact pad 110 is thermally (and generally, electrically) connected.

The second plurality of vias 114 is connected on one side to the first capture pad 113, and on another side to the second capture pad 115. Like the first capture pad 113, the second capture pad 115 has a width and a depth selected to ensure contact to all of the second plurality of vias 114. As alluded to above, providing contact and capture pads having sufficient areal dimensions to ensure contact with respective ones of the first-sixth pluralities of vias 112, 114, 116, 118, 120 and 122 serves to spread the heat generated by the semiconductor die 123 across the substrate 101, and through to the heat sink to which the second contact pad 110 is connected.

In the representative embodiment depicted in FIG. 1A, each of the first-fifth capture pads 113, 115, 117, 119 and 121, and the first and second contact pads 108, 110, are generally wider (x-direction) and deeper (y-direction) than the width and depth of the respective first-sixth pluralities of vias 112, 114, 116, 118, 120 and 122. Notably, the relative dimensions of the first-fifth capture pads 113, 115, 117, 119 and 121, and the first and second contact pads 108, 110, to the first-sixth pluralities of vias 112, 114, 116, 118, 120 and 122 is related to the first contact pad 108 that directly contacts the semiconductor die 123. As such, the areal size of the first capture pad 113 can be optimized to most efficiently remove heat from the semiconductor die 123. Moreover, each of the first-fifth capture pads 113, 115, 117, 119 and 121, and the first and second contact pads 108, 110, have substantially identical widths and depths (and, as such substantially identical areal dimensions). This is merely illustrative, and, as described in connection with other representative embodiments below, the widths and depths of the first-fifth capture pads 113, 115, 117, 119 and 121, and the first and second contact pads 108, 110, may differ. Similarly, the widths and depths of the arrays of the respective first-sixth pluralities of vias 112, 114, 116, 118, 120 and 122 are substantially identical; this too is merely illustrative, as described more fully below. Notably, however, the width and depth of each of the first-sixth pluralities of vias 112, 114, 116, 118, 120 and 122 at each level are selected to ensure contact across the widths and depths of the respective first-fifth capture pads 113, 115, 117, 119 and 121, and the first and second contact pads 108, 110. As noted above, in the representative embodiment depicted in FIG. 1A, the widths and depths of the arrays of the respective first-sixth pluralities of vias 112, 114, 116, 118, 120 and 122 are substantially identical.

In other representative embodiments described below, the widths and depths of the arrays of the respective first-sixth pluralities of vias 112, 114, 116, 118, 120 and 122 are not the same. Generally, the greater the volume of thermally (and, generally, electrically) conductive material reduces the thermal resistance, and improves the efficiency of heat dissipation. Moreover, in a structure such as semiconductor package 100, heat generated by the semiconductor die 123 tends to spread downwardly (-z direction in the depicted coordinate system shown in FIG. 1A), in a trapezoidal shape. In a representative embodiment described below in connection with FIG. 2, the overall shape of the vias, capture pads, and contact pads, have a shape approximating a trapezoid shape with increasing areal dimension between the upper surface side and the lower surface of the substrate. This trapezoidal shape of the thermally and electrically conductive components of the substrate fosters dissipation of heat emanating from the semiconductor die as the heat tends to flow over a volume that can be represented by a trapezoid. As such, along its flow from the semiconductor die 123, the heat follows the shape of the structure of the thermally and electrically conductive vias, capture pads and contact pads, which approximates a trapezoid.

However, the greater the volume of thermally conductive material, the greater the overall size of the semiconductor package 100. As such, for a given overall size, the "non-trapezoidal" shape of the first-sixth pluralities of vias 112, 114, 116, 118, 120 and 122, and the first-fifth capture pads 113, 115, 117, 119 and 121, and the first and second contact pads 108, 110 of the representative embodiment of FIG. 1A requires less space in the substrate 101, so the additional area/volume of the substrate 101, not used for dense via array, can be used for signal routing. As can be appreciated, a trade-off is made between reduced thermal resistance/improved heat dissipation provided by the so-called trapezoidal structure (described below), and the reduced footprint required for heat dissipation in the substrate 101. In applications where reduced demand for heat dissipation is needed, the "non-trapezoidal" structure of the representative embodiments of FIG. 1A is beneficial.

Furthermore, in addition to the improved thermal characteristics provided by the via arrangements in the first-sixth layers 102-107 noted above, the comparatively dense via structures of the representative embodiments, especially in the hexagonal arrangements discussed more fully below, provide an equivalent or even larger area to undertake forces transferred from the respective first-fifth capture pads 113, 115, 117, 119 and 121, and the first and second contact pads 108, 110, while at least meeting the total pad area constraint and manufacturability requirements. Moreover, the comparatively dense via structures of the representative embodiments, especially in the hexagonal arrangements discussed more fully below, provide electrical connection redundancy to reduce the risk of open circuits due to manufacturing imperfections in the semiconductor package 100.

Figure 1B:
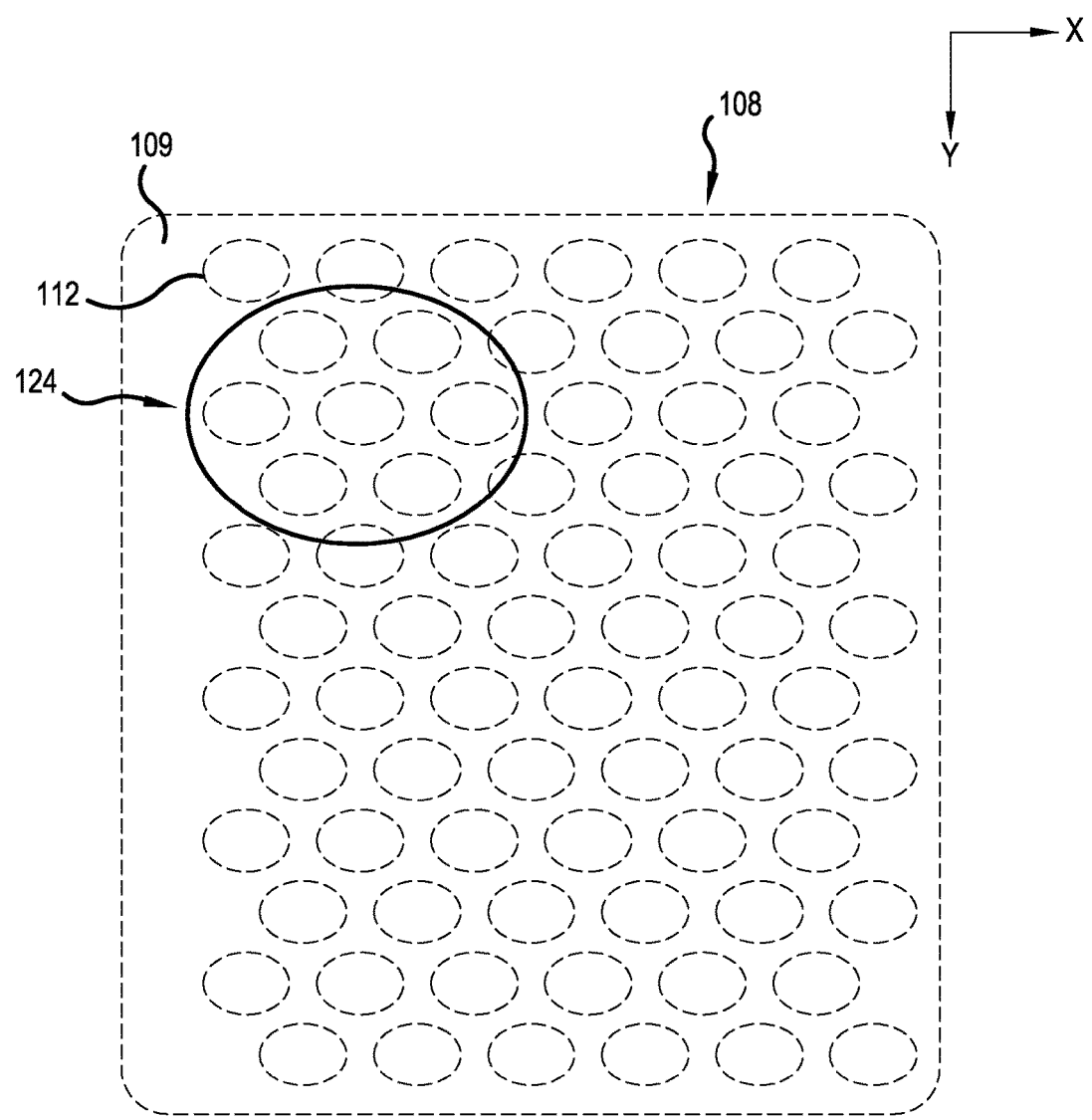
FIG. 1B shows a top view of a substrate of a semiconductor package in accordance with a representative embodiment.

FIG. 1B shows a top view of substrate 101 of semiconductor package 100 in accordance with a representative embodiment. The top view of FIG. 1B shows upper surface 109 of the substrate 101, with the semiconductor die 123 not shown (i.e., just the "apparatus" as noted above) to enable a clear description of the arrangement of the first plurality of vias 112, which are shown with dashed lines because they are, of course, disposed beneath the upper surface 109. Moreover, the first contact pad 108 is a dashed line to enable depiction of the relative orientations of the first plurality of vias 112, and the first contact pad 108. Finally, the description of only the first layer 102, the first plurality of vias 112, and the first contact pad 108 are provided. The principles and details of this description is applicable to layers 103-407, respective second-sixth pluralities of vias 114, 116, 118, 120 and 122, the first-fifth capture pads 113, 115, 117, 119 and 121, and the second contact pad 110.

The first plurality of vias 112 is arranged in a plurality of hexagonal arrangements such as the seven vias 124 over the first layer 102. As can be appreciated, providing the vias in such hexagonal arrangements provides close packing for vias. As such, providing the first plurality of vias 112 in such an arrangement provides a comparatively dense arrangement of vias. Yet, because there is spacing between the vias, and therefore, substrate material (e.g., prepreg), the structural strength of the substrate 101 is beneficially maintained. Ultimately, providing the first-sixth pluralities of vias 112, 114, 116, 118, 120 and 122 in hexagonal arrangements across each of their respective first-sixth layers 102-107 results in a comparatively low thermal resistance pathway through substrate 101.

Figure 1C:
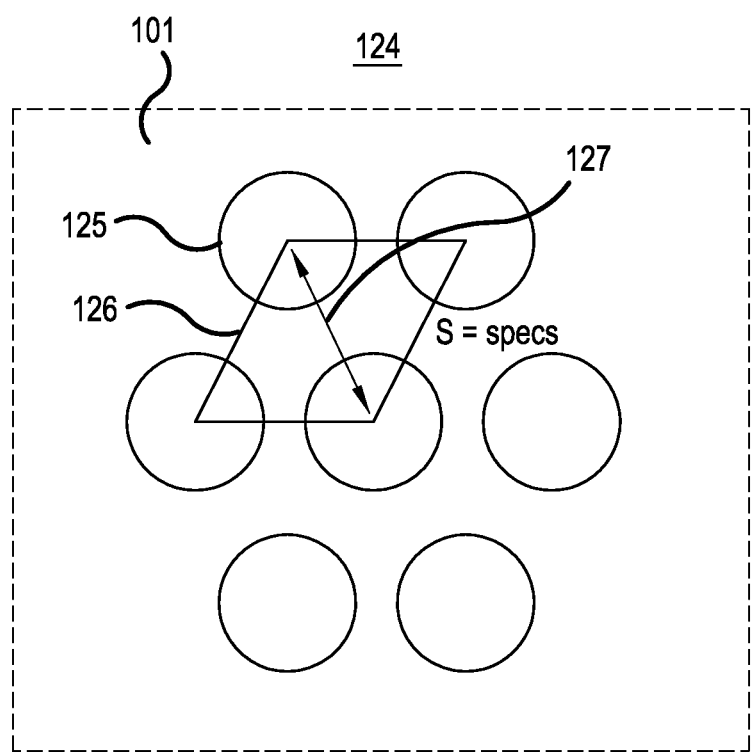
FIG. 1C shows a top view of drilled via openings in a substrate of a semiconductor package in accordance with a representative embodiment.

FIG. 1C shows a top view of a group 128 of drilled via openings 125 in substrate 101 of a semiconductor package in accordance with a representative embodiment. Illustratively, the group 128 of via openings 125 is provided in one of the first-sixth layers 102-107, by techniques described below. The via openings 125 are filled to form vias of representative embodiments, again, as described below.

As depicted, the via openings 125 are arranged in a hexagonal manner, spaced apart by lengths of sides 126 and diagonal 127, which are substantially the same. Notably, the lengths of the sides 126 and diagonal 127 can be as small as approximately 25 μm; whereas the length of sides 126 and diagonal can increase based on the power output of the semiconductor die 123. Providing spacing between the via openings 125, and thus the vias in the hexagonal arrangement of the representative embodiments, in this range results in a sufficient via density, and thus volume of thermally conductive material, to realize improved thermal conductivity across the substrate 101. However, spacing (i.e., the lengths of sides 126 and diagonal 127 of the hexagon) between the via openings 125 less than approximately 25 μm can result in insufficient substrate material (e.g., prepreg) between the via openings 125 (and thus vias), and structural integrity issues. Moreover, spacing between the via openings 125 less than approximately 25 μm can also foster unwanted electrical bridging between the vias.

Figure 2:
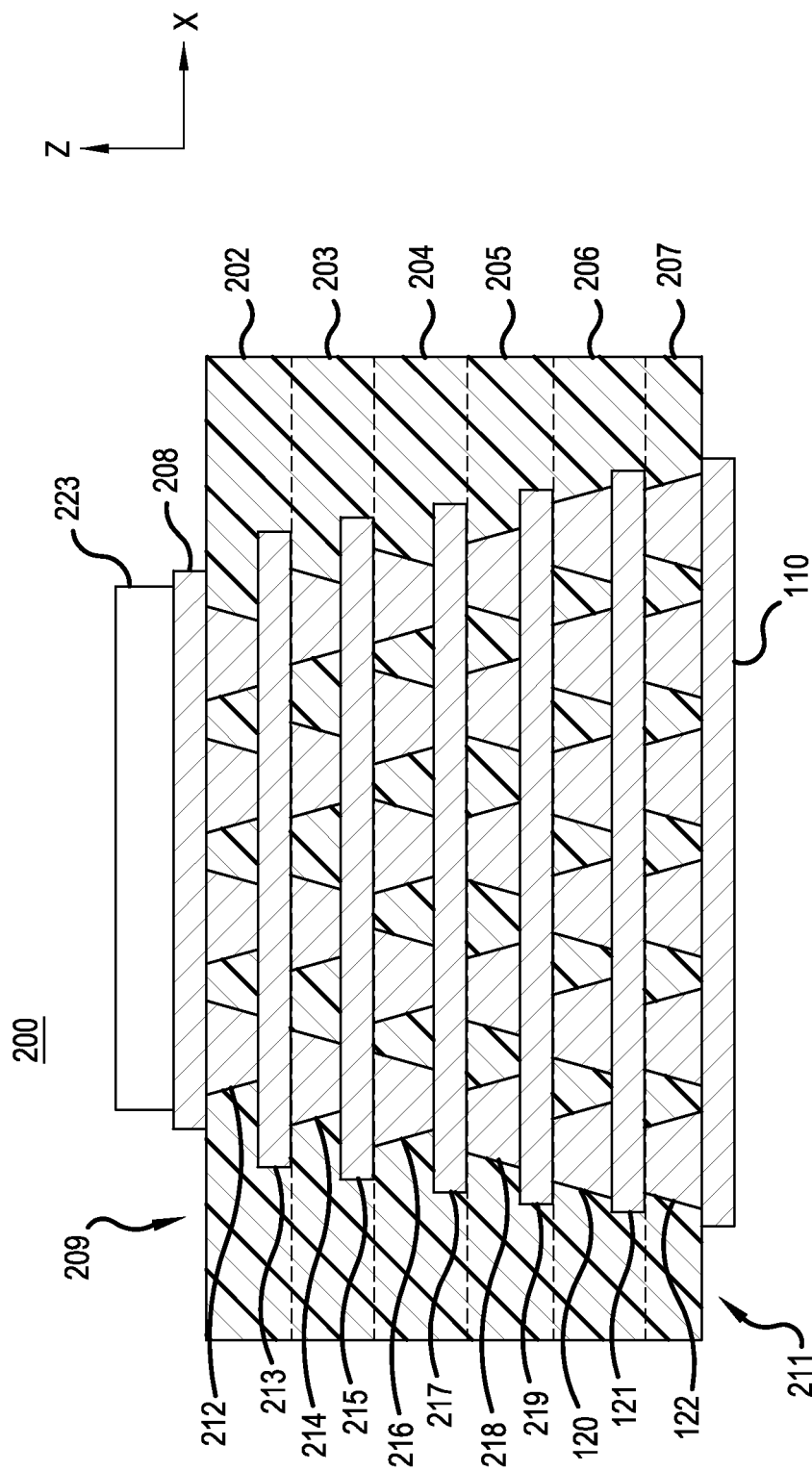
FIG. 2 show a cross-sectional view of a semiconductor package in accordance with a representative embodiment.

FIG. 2 shows a cross-sectional view of a semiconductor package 200 in accordance with a representative embodiment. Many aspects and details of the various elements of the semiconductor package 200, including devices, components, materials, arrangements of vias, shapes, and dimensions are common to those the representative embodiments described above in connection with FIGS. 1A-1C. Many of these details are often not repeated in order to avoid obscuring the presently described representative embodiments.

The semiconductor package 200 comprises a substrate 201. The substrate 201 comprises a first layer 202, a second layer 203, a third layer 204, a fourth layer 205, a fifth layer 206, and a sixth layer 207 (sometimes referred to collectively herein as layers 202-207). It is emphasized that the selection of six layers (layers 202-207) is merely illustrative, and that the substrate 201 may comprise more or fewer layers than six layers. As should be appreciated, the number of layers is selected based on design considerations and input/output requirements. The principles of the substrate 201 and the principles of its fabrication described herein are applicable to more or fewer than six layers (e.g., layers 202-207). Notably, the boundary of between each of the successive layers 202-207 is distinguished in the drawing with a dashed line as shown in FIG. 2.

A first contact pad 208 is disposed over an upper surface 209 of the first layer 202, and a second contact pad 210 is disposed over a lower surface 211 of the sixth layer 207. As described more fully below, the second contact pad 210 is connected thermally (and likely, electrically) to a heat sink (not shown), and fosters dissipation of heat, and, may be used as an electrical ground, as needed.

The first layer 202 comprises a first plurality of vias 212 disposed over a first capture pad 213. The first capture pad 213 is disposed over an upper surface (denoted by the dashed line) of the second layer 203.

The second layer 203 comprises a second plurality of vias 214 disposed over a second capture pad 215. The second capture pad 215 is disposed over an upper surface (denoted by the dashed line) of the third layer 204.

The third layer 204 comprises a third plurality of vias 216 disposed over a third capture pad 217. The third capture pad 217 is disposed over an upper surface (denoted by the dashed line) of the fourth layer 205.

The fourth layer 205 comprises a fourth plurality of vias 218 disposed over a fourth capture pad 219. The fourth capture pad 219 is disposed over an upper surface (denoted by the dashed line) of the fifth layer 206.

The fifth layer 206 comprises a fifth plurality of vias 220 disposed over a fifth capture pad 221. The fifth capture pad 221 is disposed over an upper surface (denoted by the dashed line) of the sixth layer 207.

Finally, the sixth layer 207 comprises a sixth plurality of vias 222 disposed over a second contact pad 210.

Each of the first-sixth pluralities of vias 212, 214, 216, 218, 220 and 222 are arranged in an array, with each array having vias respective first-sixth pluralities of vias 212, 214, 216, 218, 220 and 222 arranged in a hexagonal pattern, as described above. In accordance with representative embodiments, each of the first-sixth pluralities of vias 212, 214, 216, 218, 220 and 222 have a substantially circular cross-sectional shape, with a decreasing radius (e.g., first plurality of vias 212), or increasing radius (e.g., fourth plurality of vias 218), from one side to another as depicted in FIG. 1. As will become clearer as the present description continues, the variation in radius of the first-sixth pluralities of vias 212, 214, 216, 218, 220 and 222 is a result of the laser drilling technique used to form via openings in the various layers of the substrate 201. As such, the shape of the vias is not limited to the depicted shape. Rather, the each of the first-sixth pluralities of vias 212, 214, 216, 218, 220 and 222 could be cylindrical with a substantially constant radius. Alternatively, the each of the first-sixth pluralities of vias 212, 214, 216, 218, 220 and 222 could have other cross-sectional shapes with substantially constant, or increasing or decreasing areal dimensions along their length. Illustratively, the first-sixth pluralities of vias 212, 214, 216, 218, 220 and 222 could have elliptical cross-sectional shapes.

As alluded to above, in a structure such as semiconductor packages 100, 200, heat generated by the semiconductor die 123, 223 tends to spread downwardly (-z direction in the depicted coordinate system shown in FIG. 2), in a trapezoidal shape. In the representative embodiment of FIG. 2, the overall shape of the overall shape of the first-sixth pluralities of vias 212, 214, 216, 218, 220 and 222, and the first-fifth capture pads 213, 215, 217, 219 and 221, and the first and second contact pads 208, 210 have a somewhat overall "trapezoidal" shape with increasing areal dimension between the upper surface 209 and the lower surface 211 of the substrate 201. This trapezoidal shape of the thermally and electrically conductive elements of the substrate 101 fosters dissipation of heat emanating from the semiconductor die 223 as the heat tends to flow over a volume that can be represented by a trapezoid. As such, along its flow from the semiconductor die 223, the heat follows the shape of the first-sixth pluralities of vias 212, 214, 216, 218, 220 and 222, and the first-fifth capture pads 213, 215, 217, 219 and 221, and the first and second contact pads 208, 210.

The "trapezoidal" shape of the components of the substrate 201 is realized by increasing the width (x-direction in the coordinate system of FIG. 2), as depicted, and the depth (y-direction in the coordinate system of FIG. 2) of each successive capture pad of the successive layers 202-207 of the substrate 201. Specifically, each of the first-fifth capture pads 213, 215, 217, 219 and 221 has a greater width and depth than the previous one. So, the second capture pad 215 has a greater width and depth than the first capture pad 213, and the third capture pad has a greater width and depth than the first capture pad 213, and so forth. Similarly, the first capture pad 213 has a greater width and depth than the first contact pad 208, and the second contact pad 210 has a greater width and depth than the fifth capture pad 221. Of course, with the successively increasing width and depth of the first contact pad 208, the first-fifth capture pads 213, 215, 217, 219 and 221, and the second contact pad 210 the number of vias in each of the first-sixth pluralities of vias 212, 214, 216, 218, 220 and 222, successively increases as well, in order to increase the overall volume of the elements having thermally (and, likely, electrically) conductive material in the substrate 201, and in the overall shape of a trapezoid. It is noted that strict adherence to the successively increased areal dimensions (x,y dimensions in this example) is not essential, as an overall "trapezoidal" shape of the first contact pad 208, the first-fifth capture pads 213, 215, 217, 219 and 221, the second contact pad 210, and the first-sixth pluralities of vias 212, 214, 216, 218, 220 and 222 can be realized without a successive increasing the width and depth of the pads, and the numbers of vias in each layer 202-207 of the substrate 201. Just by way of example, the first contact pad 208 may have the same width and depth as the first capture pad 213, while maintaining the overall trapezoidal shape of the elements having thermally (and, likely, electrically) conductive material in the substrate 201.

Figure 3:
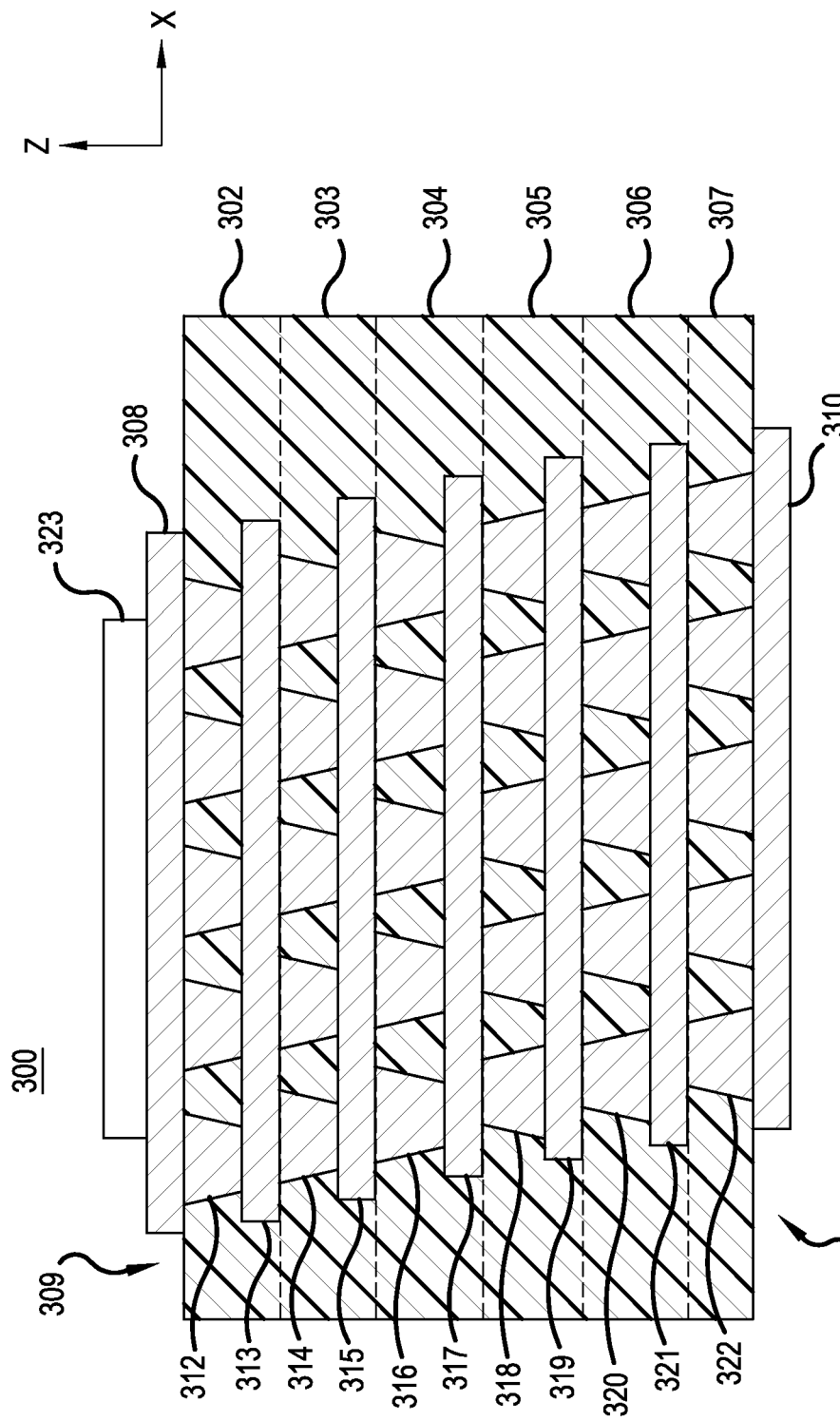
FIG. 3 shows a cross-sectional view of a semiconductor package in accordance with a representative embodiment.

FIG. 3 shows a cross-sectional view of a semiconductor package 300 in accordance with a representative embodiment. Many aspects and details of the various elements of the semiconductor package 300, including devices, components, materials, arrangements of vias, shapes, and dimensions are common to those the representative embodiments described above in connection with FIGS. 1A-2. Many of these details are often not repeated in order to avoid obscuring the presently described representative embodiments.

The semiconductor package 300 comprises a substrate 301. The substrate 301 comprises a first layer 302, a second layer 303, a third layer 304, a fourth layer 305, a fifth layer 306, and a sixth layer 307 (sometimes referred to collectively herein as layers 302-307). It is emphasized that the selection of six layers (layers 302-307) is merely illustrative, and that the substrate 301 may comprise more or fewer layers than six layers. As should be appreciated, the number of layers is selected based on design considerations and input/output requirements. The principles of the substrate 301 and the principles of its fabrication described herein are applicable to more or fewer than six layers (e.g., layers 302-307). Notably, the boundary of between each of the successive layers 302-307 is distinguished in the drawing with a dashed line as shown in FIG. 2.

A first contact pad 308 is disposed over an upper surface 309 of the first layer 302, and a second contact pad 310 is disposed over a lower surface 311 of the sixth layer 307. As described more fully below, the second contact pad 310 is connected thermally (and likely, electrically) to a heat sink (not shown), and fosters dissipation of heat, and, may be used as an electrical ground, as needed.

The first layer 302 comprises a first plurality of vias 312 disposed over a first capture pad 313. The first capture pad 313 is disposed over an upper surface (denoted by the dashed line) of the second layer 303.

The second layer 303 comprises a second plurality of vias 314 disposed over a second capture pad 315. The second capture pad 315 is disposed over an upper surface (denoted by the dashed line) of the third layer 304.

The third layer 304 comprises a third plurality of vias 316 disposed over a third capture pad 317. The third capture pad 317 is disposed over an upper surface (denoted by the dashed line) of the fourth layer 305.

The fourth layer 305 comprises a fourth plurality of vias 318 disposed over a fourth capture pad 319. The fourth capture pad 319 is disposed over an upper surface (denoted by the dashed line) of the fifth layer 306.

The fifth layer 306 comprises a fifth plurality of vias 320 disposed over a fifth capture pad 321. The fifth capture pad 321 is disposed over an upper surface (denoted by the dashed line) of the sixth layer 307.

Finally, the sixth layer 307 comprises a sixth plurality of vias 322 disposed over a second contact pad 310.

Each of the first-sixth pluralities of vias 312, 314, 316, 318, 320 and 322 are arranged in an array, with each array having vias respective first-sixth pluralities of vias 312, 314, 316, 318, 320 and 322 arranged in a hexagonal pattern, as described above. In accordance with representative embodiments, each of the first-sixth pluralities of vias 312, 314, 316, 318, 320 and 322 have a substantially circular cross-sectional shape, with a decreasing radius (e.g., first plurality of vias 312), or increasing radius (e.g., fourth plurality of vias 318), from one side to another as depicted in FIG. 1. As will become clearer as the present description continues, the variation in radius of the first-sixth pluralities of vias 312, 314, 316, 318, 320 and 322 is a result of the laser drilling technique used to form via openings in the various layers of the substrate 301. As such, the shape of the vias is not limited to the depicted shape. Rather, each of the first-sixth pluralities of vias 312, 314, 316, 318, 320 and 322 could be cylindrical with a substantially constant radius. Alternatively, each of the first-sixth pluralities of vias 312, 314, 316, 318, 320 and 322 could have other cross-sectional shapes with substantially constant, or increasing or decreasing areal dimensions along their length. Illustratively, the first-sixth pluralities of vias 312, 314, 316, 318, 320 and 322 could have elliptical cross-sectional shapes.

In the representative embodiment depicted in FIG. 3, each of the first-fifth capture pads 313, 315, 317, 319 and 321, and the first and second contact pads 308, 310, are generally wider (x-direction) and deeper (y-direction) than the width and depth of the respective first-sixth pluralities of vias 312, 314, 316, 318, 320 and 322. Moreover, each of the each of the first-fifth capture pads 313, 315, 317, 319 and 321, and the first and second contact pads 308, 310, have substantially identical widths and depths (and, as such substantially identical areal dimensions). This is merely illustrative, and, as described in connection with other representative embodiments above, the widths and depths of the first-fifth capture pads 313, 315, 317, 319 and 321, and the first and second contact pads 308, 310, may differ. Similarly, the widths and depths of the arrays of the respective first-sixth pluralities of vias 312, 314, 316, 318, 320 and 322 are substantially identical; this too is merely illustrative.

As can be appreciated from a review of FIG. 3, the first contact pad 308 and the second contact pad 310 are shifted relative to one another, with the intervening first-fifth capture pads 313-321, and respective first-sixth pluralities of vias 312, 314, 316, 318, 320 and 322 shifted accordingly. This shift provides flexibility in aligning the semiconductor package 300 to other structures (e.g., a pad on another substrate (not shown), or other semiconductor package (not shown). As such, the ease of making thermal, and likely, electrical connections from the first contact pad 308 to another structure is enhanced by the flexibility being able to arrange the first-fifth capture pads 313-321, and respective first-sixth pluralities of vias 312, 314, 316, 318, 320 and 322 as needed. As will become clearer from a review of a fabrication method of a representative embodiment described below, the present teachings facilitate arranging the thermally (and, likely electrically conductive) elements of the substrate to meet a particular connection need.

Figure 4:
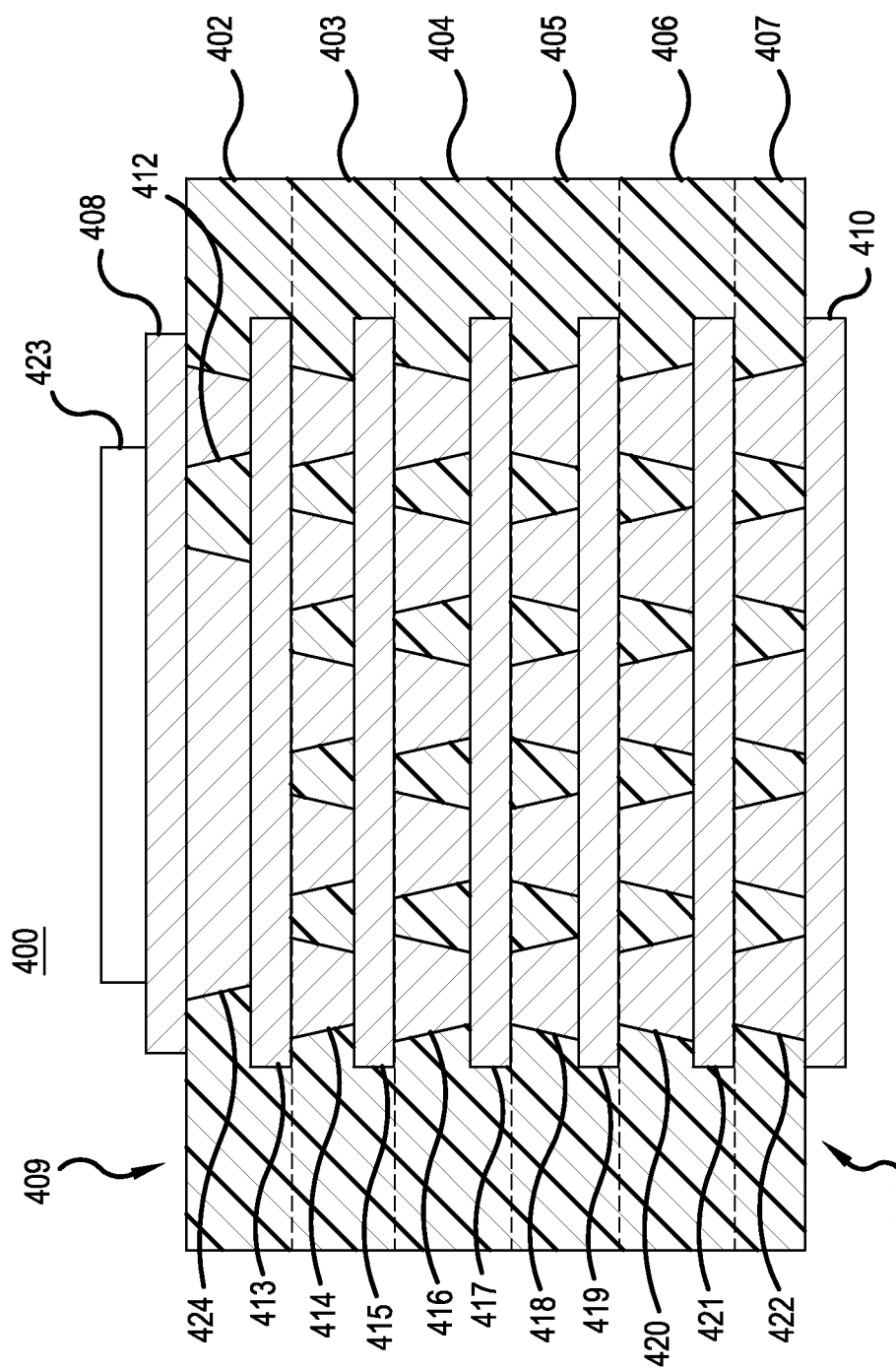
FIG. 4 shows a cross-sectional view of a semiconductor package in accordance with a representative embodiment.

FIG. 4 shows a cross-sectional view of a semiconductor package 400 in accordance with a representative embodiment. Many aspects and details of the various elements of the semiconductor package 400, including devices, components, materials, arrangements of vias, shapes, and dimensions are common to those the representative embodiments described above in connection with FIGS. 1A-3. Many of these details are often not repeated in order to avoid obscuring the presently described representative embodiments.

The semiconductor package 400 comprises a substrate 401. The substrate 401 comprises a first layer 402, a second layer 403, a third layer 404, a fourth layer 405, a fifth layer 406, and a sixth layer 407 (sometimes referred to collectively herein as layers 402-407). It is emphasized that the selection of six layers (layers 402-407) is merely illustrative, and that the substrate 401 may comprise more or fewer layers than six layers. As should be appreciated, the number of layers is selected based on design considerations and input/output requirements. The principles of the substrate 401 and the principles of its fabrication described herein are applicable to more or fewer than six layers (e.g., layers 402-407). Notably, the boundary of between each of the successive layers 402-407 is distinguished in the drawing with a dashed line as shown in FIG. 1A.

A first contact pad 408 is disposed over an upper surface 409 of the first layer 402, and a second contact pad 410 is disposed over a lower surface 411 of the sixth layer 407. As described more fully below, the second contact pad 410 is connected thermally (and likely, electrically) to a heat sink (not shown), and fosters dissipation of heat, and, may be used as an electrical ground, as needed.

The first layer 402 comprises a first plurality of vias 412 disposed over a first capture pad 413. The first layer also comprises a single large via 424 that has a width (x-direction in the coordinate system of FIG. 4) and a depth (y-direction in the coordinate system of FIG. 4) that is substantially greater than the vias of the first plurality of vias 412. The first capture pad 413 is disposed over an upper surface (denoted by the dashed line) of the second layer 403.

The second layer 403 comprises a second plurality of vias 414 disposed over a second capture pad 415. The second capture pad 415 is disposed over an upper surface (denoted by the dashed line) of the third layer 404.

The third layer 404 comprises a third plurality of vias 416 disposed over a third capture pad 417. The third capture pad 417 is disposed over an upper surface (denoted by the dashed line) of the fourth layer 405.

The fourth layer 405 comprises a fourth plurality of vias 418 disposed over a fourth capture pad 419. The fourth capture pad 419 is disposed over an upper surface (denoted by the dashed line) of the fifth layer 406.

The fifth layer 406 comprises a fifth plurality of vias 420 disposed over a fifth capture pad 421. The fifth capture pad 421 is disposed over an upper surface (denoted by the dashed line) of the sixth layer 407.

Finally, the sixth layer 407 comprises a sixth plurality of vias 422 disposed over a second contact pad 410.

Each of the first-sixth pluralities of vias 412, 414, 416, 418, 420 and 422 are arranged in an array, with each array having vias respective first-sixth pluralities of vias 412, 414, 416, 418, 420 and 422 arranged in a hexagonal pattern. In accordance with representative embodiments, each of the first-sixth pluralities of vias 412, 414, 416, 418, 420 and 422 have a substantially circular cross-sectional shape, with a decreasing radius (e.g., first plurality of vias 412), or increasing radius (e.g., fourth plurality of vias 118), from one side to another as depicted in FIG. 1. As will become clearer as the present description continues, the variation in radius of the first-sixth pluralities of vias 412, 414, 416, 418, 420 and 422 is a result of the laser drilling technique used to form via openings in the various layers of the substrate 401. As such, the shape of the vias is not limited to the depicted shape. Rather, the each of the first-sixth pluralities of vias 412, 414, 416, 418, 420 and 422 could be cylindrical with a substantially constant radius. Alternatively, the each of the first-sixth pluralities of vias 412, 414, 416, 418, 420 and 422 could have other cross-sectional shapes with substantially constant, or increasing or decreasing areal dimensions along their length. Illustratively, the first-sixth pluralities of vias 412, 414, 416, 418, 420 and 422 could have elliptical cross-sectional shapes.

As can be appreciated, the substrate 401 is substantively very similar to the structure of substrate 101. However, like the representative embodiments described above in connection with FIGS. 2 and 3, elements having thermally (and, likely, electrically) conductive material can have an overall trapezoidal shape, or could be "shifted," or both.

As depicted in FIG. 4, a semiconductor die 423 is disposed over first contact pad 408, and predominantly over the single via 424. By placing the semiconductor die 423 over the single via 424, which has a comparatively large volume of thermally conductive material, a significant degree of heat transfer occurs at the source. This heat can then spread over the elements in the substrate 401 having thermally (and, likely, electrically) conductive material, thereby improving the thermal efficiency of the semiconductor package 400.

Figure 5:
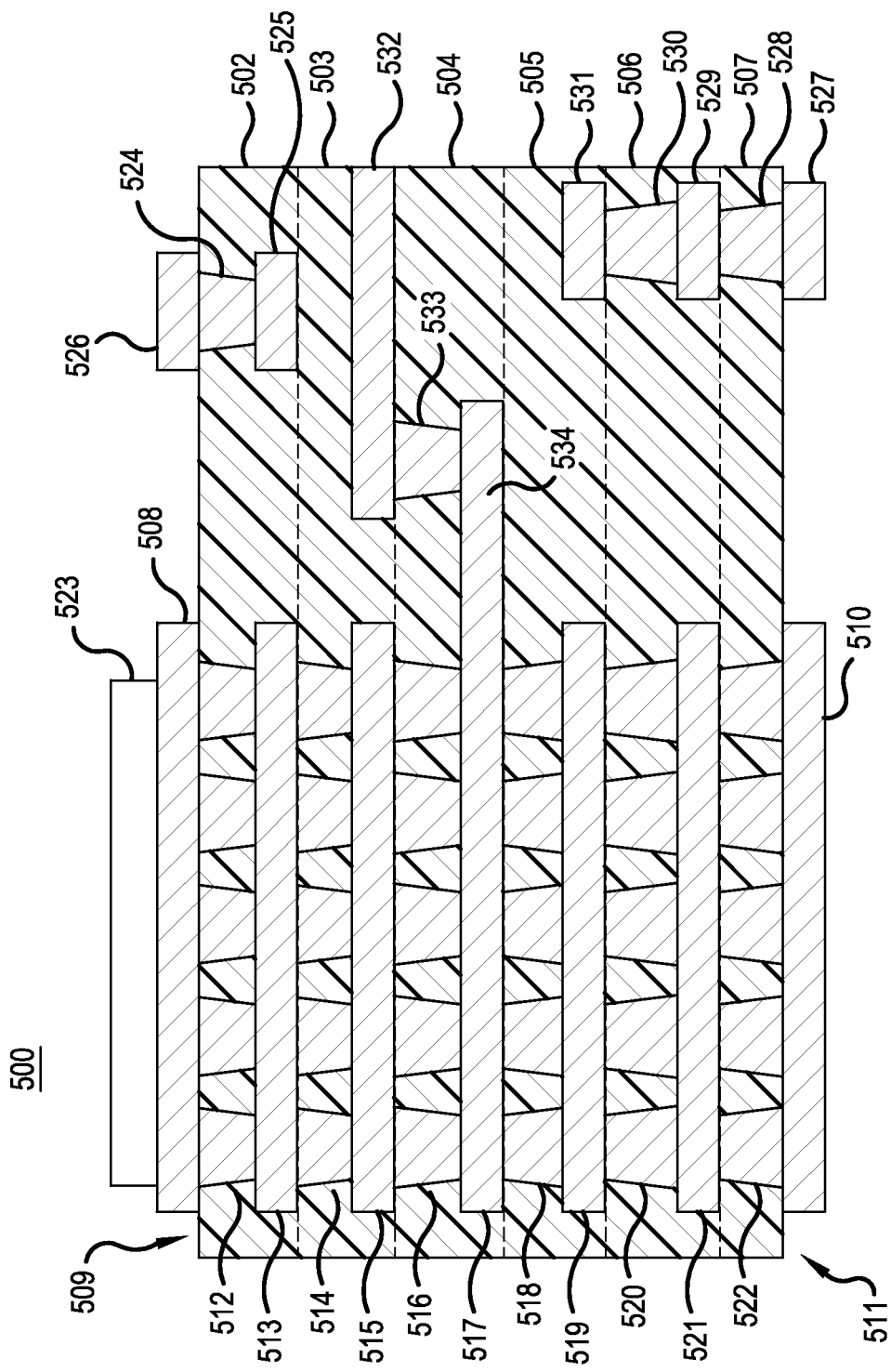
FIG. 5 shows a semiconductor package in accordance with a representative embodiment.

FIG. 5 shows a semiconductor package 500 in accordance with a representative embodiment. Many aspects and details of the various elements of the semiconductor package 500, including devices, components, materials, arrangements of vias, shapes, and dimensions are common to those the representative embodiments described above in connection with FIGS. 1A-5. Many of these details are often not repeated in order to avoid obscuring the presently described representative embodiments.

The semiconductor package 500 comprises a substrate 501. The substrate 501 comprises a first layer 502, a second layer 503, a third layer 504, a fourth layer 505, a fifth layer 506, and a sixth layer 507 (sometimes referred to collectively herein as layers 502-507).

As can be appreciated, the substrate 501 is substantively very similar to the structure of substrate 101. However, like the representative embodiments described above in connection with FIGS. 2 and 3, elements having thermally (and, likely, electrically) conductive material can have an overall trapezoidal shape, or could be "shifted," or both.

It is emphasized that the selection of six layers (layers 502-507) is merely illustrative, and that the substrate 501 may comprise more or fewer layers than six layers. As should be appreciated, the number of layers is selected based on design considerations and input/output requirements. The principles of the substrate 501 and the principles of its fabrication described herein are applicable to more or fewer than six layers (e.g., layers 502-507). Notably, the boundary of between each of the successive layers 502-507 is distinguished in the drawing with a dashed-line as shown in FIG. 1A.

A first contact pad 508 is disposed over an upper surface 509 of the first layer 502, and a second contact pad 510 is disposed over a lower surface 511 of the sixth layer 507. As described more fully below, the second contact pad 510 is connected thermally (and likely, electrically) to a heat sink (not shown), and fosters dissipation of heat, and, may be used as an electrical ground, as needed.

The first layer 502 comprises a first plurality of vias 512 disposed over a first capture pad 513. The first layer also comprises a first routing via 524, which is connects a first trace 526 disposed over the upper surface 509 with a second trace 527 in the first layer 502. The first and second traces 526,527 are connected to other components (not shown) of the semiconductor package 500, and may be used to make signal or ground connections.

The second layer 503 comprises a second plurality of vias 514 disposed over a second capture pad 515. The second capture pad 515 is disposed over an upper surface (denoted by the dashed line) of the third layer 504.

The third layer 504 comprises a third plurality of vias 516 disposed over a third capture pad 517. The third capture pad 517 is disposed over an upper surface (denoted by the dashed line) of the fourth layer 505.

The fourth layer 505 comprises a fourth plurality of vias 518 disposed over a fourth capture pad 519. The fourth capture pad 519 is disposed over an upper surface (denoted by the dashed line) of the fifth layer 506.

The fifth layer 506 comprises a fifth plurality of vias 520 disposed over a fifth capture pad 521. The fifth capture pad 521 is disposed over an upper surface (denoted by the dashed line) of the sixth layer 507.

Finally, the sixth layer 507 comprises a sixth plurality of vias 522 disposed over a second contact pad 510.

A second routing via 528 and a third routing via 530 connect a third trace 527, a fourth trace 529 and a fifth trace 531, and thereby makes connections to components (not shown) disposed over the lower surface 511, and in the sixth, fifth and fourth layers 507, 506 and 505. Again, signal or ground connections can be made using the routing vias of the representative embodiments.

A fourth routing via 533 is disposed between a sixth trace 532 disposed in the second layer 503, and a seventh trace 534 disposed in the third layer 504. The seventh trace 534 is connected to the third capture pad 517. The seventh trace 534 can provide a thermal path to a heat sink (not shown) connected to the second contact pad 510, for example. Moreover, if the second contact pad 510 is connected electrically to ground, the seventh trace can provide an electrical connection to ground for a component connected to the sixth trace 532. As can be appreciated, a plethora of possible electrical connections, or thermal connections, or both, can be realized by selective placement of vias and traces in the substrate 501.

FIGS. 6A-6F show cross-sectional view of a sequence of fabricating a semiconductor package 600 in accordance with a representative embodiment. Many aspects and details of the various elements of the semiconductor package 600, including materials, arrangements of vias, shapes, and dimensions are common to those the representative embodiments described above in connection with FIGS. 1A-5. Many of these details are often not repeated in order to avoid obscuring the presently described representative embodiments. Moreover, many aspects of the method are described in above-referenced U.S. Pat. No. 8,946,904, and are often not repeated.

FIG. 6A shows a cross-sectional view with a first layer 601 disposed over a second layer 602. A first contact pad 603 and a trace 604 are disposed over the second layer. The first contact pad 603 is provided on a carrier (not shown), and the first and second layers 601, 602 are laminated over the first contact pad 603 and the trace 604.

A first plurality of via openings 605 and a first routing via opening 606 are formed in the first layer 601. Similarly, a second plurality of via openings 607 is formed in the second layer 602. The first and second pluralities of via openings 605, 607 are formed in an array with a plurality of hexagonally arranged via openings, such as described above in connection with the representative embodiments.

The first plurality of via openings 605 and a first routing via opening 606, as well as other openings formed in various layers described below, are formed using well-known laser drilling techniques, according to a representative embodiment. Alternatively, if the material used for the first and second layers 601, 602 (and subsequent layers described below) were a photo-imageable dielectric material, known wet etching or drying etching methods commonly used in semiconductor processing methods, for example, could be used to form the first plurality of via openings 605 and a first routing via opening 606, as well as other openings formed in various layers described below. For example, a known dry-etching method, which uses a plasma-etchant, could be used. This method, commonly known as the Bosch method, may be used to provide via openings (and thus, vias) having comparatively high aspect ratios. Just by way of example, the Bosh method, and other etching methods, could be used to form substantially cylindrical vias, rather than vias with decreasing (or increasing) radii with depth.

Referring to FIG. 6B, the first plurality of via openings 605 and the first routing via opening 606 are in the first layer 601, and the second plurality of via openings 607 are plated to form a first plurality of vias 608, a first routing via 610, and a second plurality of vias 609. After the first and second pluralities of vias 608, 609 are formed, a first capture pad 611, and a first trace 615 are formed over an upper surface 612 of the first layer 601 by plating; and a second capture pad 613 and a second trace 616 are formed over a lower surface 614 of the second layer 602 by plating. The plating sequence used known methods, such as those described in U.S. Pat. No. 8,946,904.

Figure 6C:
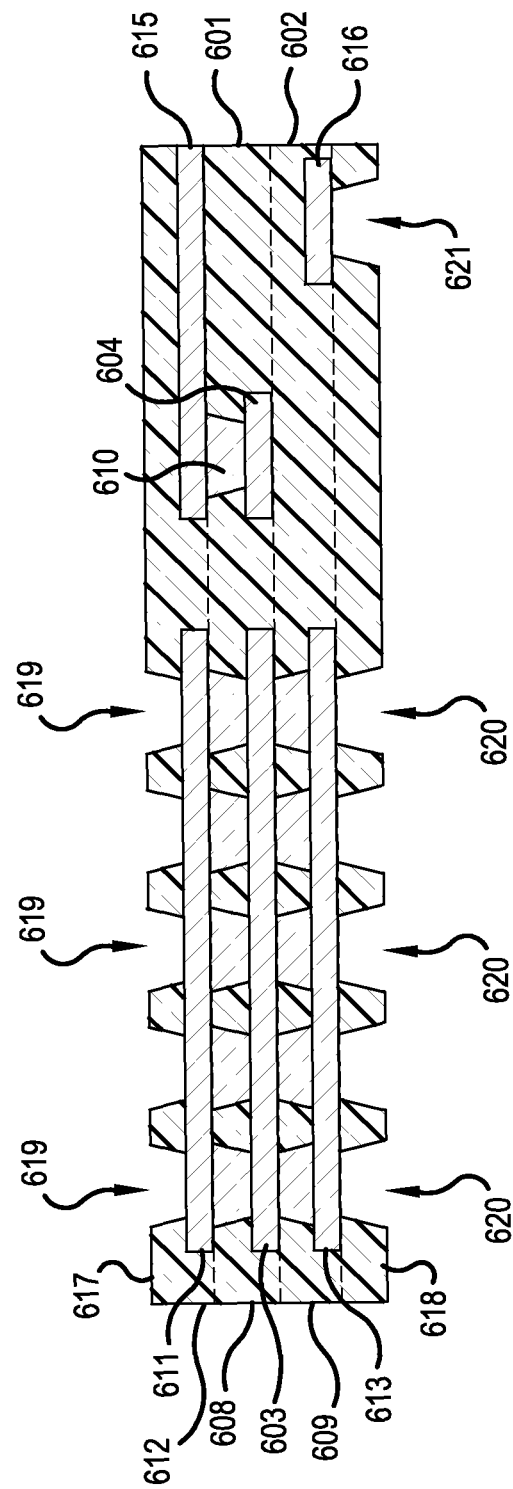

Referring to FIG. 6C, a third layer 617 is formed over the first layer 601 by lamination; and a fourth layer 618 is formed beneath the second layer 602, also by lamination. Next, a third plurality of via openings 619 is formed in the third layer 617. A fourth plurality of via openings 620 and a second routing via opening 621 are formed in the fourth layer 618.

Figure 6D:
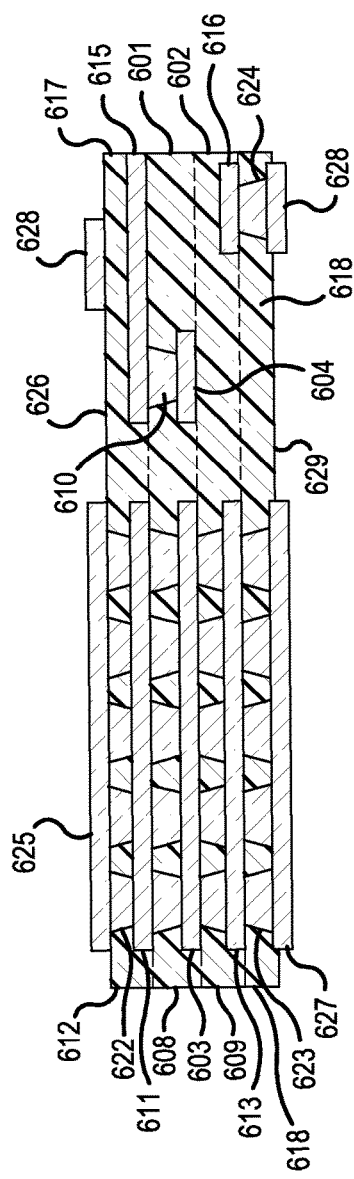

Referring to FIG. 6D, the third plurality of via openings 619 in the first layer 601, and the second plurality of via openings 620 are plated to form a third plurality of vias 622, a fourth plurality of vias 623, and a second routing via 624. After the third plurality of vias 622 and the fourth plurality of vias 623 are formed, a third capture pad 625 is formed over an upper surface 626 of the third layer 617 by plating; and a fourth capture pad 627 and a third trace 628 are formed over a lower surface 629 of the fourth layer 618 by plating.

Figure 6E:
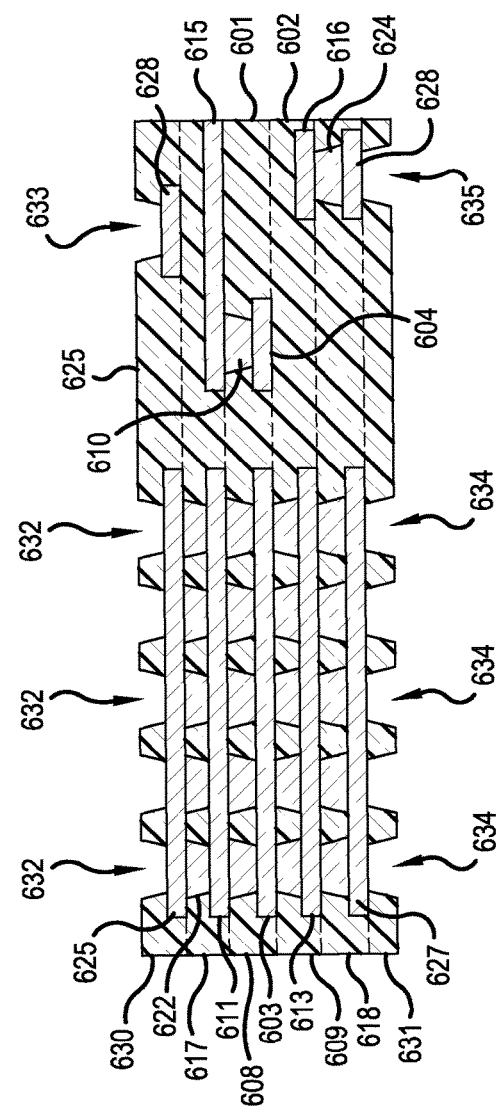

Referring to FIG. 6E, a fifth layer 630 is formed over the third layer 617 by lamination; and a sixth layer 631 is formed beneath the fourth layer 618, also by lamination. Next, a fifth plurality of via openings 632 and a third routing via 633 are formed in the fifth layer 630. A sixth plurality of via openings 634 and a fourth routing via opening 635 are formed in the sixth layer 631.

Figure 6F:
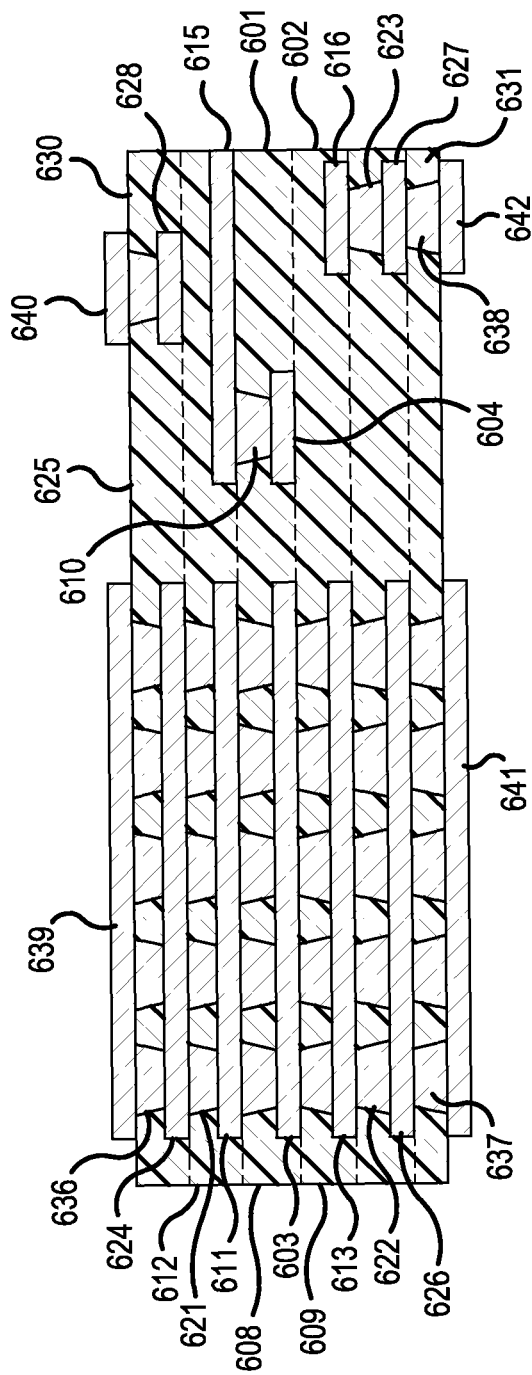

Referring to FIG. 6F, the fifth plurality of via openings 632, the sixth plurality of via openings 634, the third routing via 633, and the fourth routing via opening 635 are plated to form a fifth plurality of vias 636, a sixth plurality of vias 637, and a fourth routing via 538. After the fifth plurality of vias and the sixth plurality of vias are formed, a first contact 639 pad and a fourth trace 640 is formed over an upper surface of the fifth layer 630 by plating; and a second contact pad 641 and a fifth trace 642 are formed over a lower surface of the fourth layer 618 by plating.

In view of this disclosure it is noted that the various semiconductor packages and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

We claim:
1. An apparatus, comprising:
   a substrate;
   a first plurality of tapered vias disposed in the substrate, the first plurality of tapered vias being disposed in a hexagonal arrangement;
   a first capture pad disposed beneath the first plurality of tapered vias, the first capture pad having a first width;
   a second plurality of tapered vias disposed in the substrate and beneath the first capture pad, the second plurality of tapered vias being disposed in the hexagonal arrangement;
   a first contact pad disposed over an upper surface of the substrate, and in direct contact with at least one of the first plurality of tapered vias;
   a second capture pad having a second width that is greater than the first width;
   a third plurality of tapered vias disposed in the substrate and beneath the second capture pad, the third plurality of tapered vias being disposed in the hexagonal arrangement; and
   a second contact pad disposed over a lower surface of the substrate, the second contact pad being in direct contact with at least one of the third plurality of tapered vias.

2. The apparatus as claimed in claim 1, wherein portions of the substrate are disposed between at least two of the first plurality of tapered vias, and between at least two of the second plurality of tapered vias.

3. The apparatus as claimed in claim 1, wherein the first capture pad electrically and thermally connects each of the first plurality of tapered vias.

4. The apparatus as claimed in claim 1, wherein the apparatus further comprises:
   a third capture pad; and
   a fourth plurality of tapered vias disposed in the substrate and beneath the third capture pad, the fourth plurality of tapered vias being disposed in the hexagonal arrangement.

5. The apparatus as claimed in claim 4, wherein the third plurality of tapered vias is disposed beneath the third capture pad.

6. The apparatus as claimed in claim 1, wherein the first capture pad, the first, second and third pluralities of tapered vias, and the second capture pad are disposed in a trapezoidal areal manner.

7. The apparatus as claimed in claim 1, wherein the first capture pad is substantially aligned with the second capture pad.

8. The apparatus as claimed in claim 1, wherein each of the tapered vias of the first and second plurality of tapered vias has a height, and a substantially circular cross-section.

9. The apparatus as claimed in claim 8, wherein a diameter of each of the tapered vias decreases across its height.

10. A semiconductor package, comprising:
    an active semiconductor die disposed over first contact pad of the apparatus of claim 1.

11. The semiconductor package as claimed in claim 10, wherein
    the first contact pad is electrically connected to ground.

12. The semiconductor package as claimed in claim 10, wherein
    the active semiconductor die comprises at least one Group III-V semiconductor device.

13. The semiconductor package as claimed in claim 12, wherein the at least one Group III-V semiconductor device comprise a heterojunction bipolar transistor (HBT), or a pseudomorphic high electron mobility transistor (pHEMT).

14. An apparatus, comprising:
    a substrate;
    a first plurality of tapered vias disposed in the substrate, the tapered vias being disposed in a hexagonal arrangement, wherein an areal dimension of each of the first plurality of tapered vias increases or decreases across its height;
a capture pad disposed beneath the first plurality of tapered vias;
a second plurality of tapered vias disposed in the substrate and beneath the capture pad, the second plurality of tapered vias being disposed in the hexagonal arrangement; and
a contact pad disposed over an upper surface of the substrate, and in direct contact with at least one of the first plurality of tapered vias.

15. The apparatus as claimed in claim 14, wherein an areal dimension of each of the second plurality of tapered vias increases or decreases across its height.

16. The apparatus as claimed in claim 14, wherein each of the first and second plurality of tapered vias has a height, and a substantially circular cross-section.

17. The apparatus as claimed in claim 14, wherein portions of the substrate are disposed between at least two of the first plurality of tapered vias, and between at least two of the second plurality of tapered vias.

18. The apparatus as claimed in claim 14, wherein the capture pad is a first capture pad, and the contact pad is a first contact pad, and the apparatus further comprises:
a second capture pad;
a third plurality of tapered vias disposed in the substrate and beneath the second capture pad, the third plurality of tapered vias being disposed in the hexagonal arrangement; and
a second contact pad disposed over a lower surface of the substrate, the second contact pad being in direct contact with at least one of the third plurality of tapered vias.

19. The apparatus as claimed in claim 14, wherein the capture pad electrically and thermally connects each of the first plurality of tapered vias.

20. The apparatus as claimed in claim 18, further comprising:
a third capture pad; and
a fourth plurality of tapered vias disposed in the substrate and beneath the third capture pad, the fourth plurality of tapered vias being disposed in the hexagonal arrangement.

21. The apparatus as claimed in claim 20, wherein the third plurality of tapered vias is disposed beneath the third capture pad.

22. The apparatus as claimed in claim 18, wherein the first capture pad has a first width, and the second capture pad has a second width that is greater than the first width.

23. The apparatus as claimed in claim 22, wherein the first capture pad, the first, second and third pluralities of tapered vias, and the second capture pad are disposed in a trapezoidal areal manner.

24. The apparatus as claimed in claim 18, wherein the first capture pad has a first width, and the second capture pad has a second width that is approximately the same as the first width.

25. The apparatus as claimed in claim 24, wherein the first capture pad is substantially aligned with the second capture pad.

26. The apparatus as claimed in claim 24, wherein the first capture pad is offset relative to the second capture pad.

27. A semiconductor package, comprising:
an active semiconductor die disposed over first contact pad of the apparatus of claim 18.

28. The semiconductor package as claimed in claim 27, wherein the first contact pad is electrically connected to ground.

29. The semiconductor package as claimed in claim 27, wherein the active semiconductor die comprises at least one Group III-V semiconductor device.

30. The semiconductor package as claimed in claim 29, wherein the at least one Group III-V semiconductor device comprise a heterojunction bipolar transistor (HBT), or a pseudomorphic high electron mobility transistor (pHEMT).

31. An apparatus, comprising:
a substrate;
a first plurality of tapered vias disposed in the substrate, the first plurality of tapered vias being disposed in a hexagonal arrangement;
a first capture pad disposed beneath the first plurality of tapered vias, the first capture pad having a first width;
a second plurality of tapered vias disposed in the substrate and beneath the first capture pad, the second plurality of tapered vias being disposed in the hexagonal arrangement;
a first contact pad disposed over an upper surface of the substrate, and in direct contact with at least one of the first plurality of tapered vias;
a second capture pad having a second width that is approximately the same as the first width, wherein the first capture pad is offset relative to the second capture pad;
a third plurality of tapered vias disposed in the substrate and beneath the second capture pad, the third plurality of tapered vias being disposed in the hexagonal arrangement; and
a second contact pad disposed over a lower surface of the substrate, the second contact pad being in direct contact with at least one of the third plurality of tapered vias.

32. The apparatus as claimed in claim 31, further comprising:
a third capture pad; and
a fourth plurality of tapered vias disposed in the substrate and beneath the third capture pad, the fourth plurality of tapered vias being disposed in the hexagonal arrangement.

33. The apparatus as claimed in claim 32, wherein the third plurality of tapered vias is disposed beneath the third capture pad.

34. The apparatus as claimed in claim 31, wherein the first capture pad, the first, second and third pluralities of tapered vias, and the second capture pad are disposed in a trapezoidal areal manner.

35. A semiconductor package, comprising: an active semiconductor die disposed over first contact pad of the apparatus of claim 31.

36. The semiconductor package as claimed in claim 35, wherein the first contact pad is electrically connected to ground.

37. The semiconductor package as claimed in claim 35, wherein the active semiconductor die comprises at least one Group III-V semiconductor device.

38. The semiconductor package as claimed in claim 37, wherein the at least one Group III-V semiconductor device comprise a heterojunction bipolar transistor (HBT), or a pseudomorphic high electron mobility transistor (pHEMT).

39. The apparatus of claim 1, wherein the second contact pad has a width that is greater than a width of the first contact pad.

40. The apparatus of claim 31, wherein the second contact pad has a width that is greater than a width of the first contact pad.

\* \* \* \* \*